(12) United States Patent
Lee et al.

(10) Patent No.: US 8,449,949 B2
(45) Date of Patent: May 28, 2013

(54) COMPOSITIONS AND METHODS FOR CREATING ELECTRONIC CIRCUITRY

(75) Inventors: Yueh-Ling Lee, Raleigh, NC (US); Shane Fang, Newark, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 31 days.

(21) Appl. No.: 13/214,624

(22) Filed: Aug. 22, 2011

(65) Prior Publication Data

US 2011/0302778 A1  Dec. 15, 2011

Related U.S. Application Data

(62) Division of application No. 12/169,212, filed on Jul. 8, 2008.

(60) Provisional application No. 60/958,744, filed on Jul. 9, 2007.

(51) Int. Cl.
*H05K 3/02*       (2006.01)

(52) U.S. Cl.
USPC .......................................... 427/554; 427/555

(58) Field of Classification Search
USPC .. 427/96.1, 282, 555, 554, 553, 558; 428/901
See application file for complete search history.

(56) References Cited

U.S. PATENT DOCUMENTS

| | | | |
|---|---|---|---|
| 2,833,686 A | 5/1958 | Sandt | |
| 2,946,763 A | 7/1960 | Bro et al. | |
| 3,056,881 A | 10/1962 | Schwarz | |
| 3,772,161 A | 11/1973 | Bogard et al. | |
| 3,928,670 A | 12/1975 | Brummett et al. | |
| 3,991,013 A | 11/1976 | Pletcher | |
| 3,991,014 A | 11/1976 | Kleinschuster | |
| 4,011,199 A | 3/1977 | McFarlane et al. | |
| 4,048,148 A | 9/1977 | Morgan | |
| 4,075,262 A | 2/1978 | Schaefgen | |
| 4,083,829 A | 4/1978 | Calundann et al. | |

(Continued)

FOREIGN PATENT DOCUMENTS

| | | |
|---|---|---|
| DE | 101 32 092 | 1/2003 |
| EP | 0 256 778 | 2/1988 |

(Continued)

OTHER PUBLICATIONS

W J. Jackson, Jr., "Liquid Crystal Polymers: VI Liquid Crystalline Polyesters of Substituted Hydroquinones," Contemporary-Topics in Polymer Science, 1984, vol. 5, pp. 177-208.

(Continued)

*Primary Examiner* — Michael Cleveland
*Assistant Examiner* — Tabassom Tadayyon Eslami (57) ABSTRACT

The present invention is directed to non-lithographic patterning by laser (or similar-type energy beam) ablation, where the ablation system ultimately results in circuitry features that are relative free from debris induced over-plating defects (debris relating to the ablation process) and fully additive plating induced over-plating defects. Compositions of the invention include a circuit board precursor having an insulating substrate and a cover layer. The insulating substrate is made from a dielectric material and also a metal oxide activatable filler. The cover layer can be sacrificial or non-sacrificial and is used to remediate unwanted debris arising from the ablation process.

1 Claim, 2 Drawing Sheets

U.S. PATENT DOCUMENTS

| | | | |
|---|---|---|---|
| 4,118,372 A | 10/1978 | Schaefgen | |
| 4,122,070 A | 10/1978 | Morgan | |
| 4,130,545 A | 12/1978 | Calundann | |
| 4,153,779 A | 5/1979 | Jackson, Jr. et al. | |
| 4,159,365 A | 6/1979 | Payet | |
| 4,159,414 A | 6/1979 | Suh et al. | |
| 4,161,470 A | 7/1979 | Calundann | |
| 4,169,933 A | 10/1979 | Jackson, Jr. et al. | |
| 4,181,538 A | 1/1980 | Narayan et al. | |
| 4,184,996 A | 1/1980 | Calundann | |
| 4,189,549 A | 2/1980 | Matsunaga et al. | |
| 4,218,494 A | 8/1980 | Belmondo et al. | |
| 4,219,461 A | 8/1980 | Calundann | |
| 4,232,143 A | 11/1980 | Irwin | |
| 4,232,144 A | 11/1980 | Irwin | |
| 4,238,600 A | 12/1980 | Jackson, Jr. et al. | |
| 4,242,496 A | 12/1980 | Jackson, Jr. et al. | |
| 4,245,082 A | 1/1981 | Irwin | |
| 4,256,624 A | 3/1981 | Calundann | |
| 4,269,965 A | 5/1981 | Irwin | |
| 4,272,625 A | 6/1981 | McIntyre et al. | |
| 4,286,250 A | 8/1981 | Sacchetti | |
| 4,338,506 A | 7/1982 | Geller et al. | |
| 4,370,466 A | 1/1983 | Siemionko | |
| 4,383,105 A | 5/1983 | Irwin | |
| 4,447,592 A | 5/1984 | Harris, Jr. | |
| 4,489,230 A | 12/1984 | Yamamoto | |
| 4,522,974 A | 6/1985 | Calundann et al. | |
| 4,617,369 A | 10/1986 | Huynh-Ba | |
| 4,664,972 A | 5/1987 | Connolly | |
| 4,684,712 A | 8/1987 | Ueno et al. | |
| 4,694,138 A | 9/1987 | Oodaira et al. | |
| 4,727,129 A | 2/1988 | Hisgen et al. | |
| 4,727,131 A | 2/1988 | Kock et al. | |
| 4,728,714 A | 3/1988 | Hisgen et al. | |
| 4,749,769 A | 6/1988 | Kock et al. | |
| 4,762,907 A | 8/1988 | Kock | |
| 4,778,927 A | 10/1988 | Kock | |
| 4,816,555 A | 3/1989 | Hisgen et al. | |
| 4,849,499 A | 7/1989 | Fagerburg et al. | |
| 4,851,496 A | 7/1989 | Poll et al. | |
| 4,851,497 A | 7/1989 | Wakui et al. | |
| 4,857,626 A | 8/1989 | Kishiro et al. | |
| 4,864,013 A | 9/1989 | Kageyama et al. | |
| 4,868,278 A | 9/1989 | MacDonald et al. | |
| 4,882,200 A | 11/1989 | Liu et al. | |
| 4,882,410 A | 11/1989 | Neugebauer et al. | |
| 4,923,947 A | 5/1990 | Coassolo et al. | |
| 4,999,416 A | 3/1991 | Kaminade et al. | |
| 5,015,721 A | 5/1991 | Gabrielli et al. | |
| 5,015,722 A | 5/1991 | Charbonneau et al. | |
| 5,022,960 A | 6/1991 | Takeyama et al. | |
| 5,025,082 A | 6/1991 | Kishiro et al. | |
| 5,086,158 A | 2/1992 | Hayashi et al. | |
| 5,088,008 A | 2/1992 | Takeyama et al. | |
| 5,091,103 A * | 2/1992 | Dean et al. .................... 510/175 | |
| 5,102,935 A | 4/1992 | Heinz et al. | |
| 5,110,896 A | 5/1992 | Waggoner et al. | |
| 5,137,618 A | 8/1992 | Burnett et al. | |
| 5,143,956 A | 9/1992 | Pielartzik et al. | |
| 5,162,977 A | 11/1992 | Paurus et al. | |
| 5,166,308 A | 11/1992 | Kreuz et al. | |
| 5,192,581 A | 3/1993 | Hirsch et al. | |
| 5,298,331 A | 3/1994 | Kanakarajan et al. | |
| 5,576,073 A | 11/1996 | Kickelhain | |
| 5,609,746 A | 3/1997 | Farrar et al. | |
| 5,674,372 A | 10/1997 | Kukanskis et al. | |
| 5,721,150 A | 2/1998 | Pasch | |
| 5,780,201 A | 7/1998 | Sabnis et al. | |
| 5,789,121 A * | 8/1998 | Cywar et al. ................... 430/9 | |
| 5,870,274 A | 2/1999 | Lucas | |
| 5,883,000 A | 3/1999 | Pasch | |
| 5,965,273 A | 10/1999 | Walpita et al. | |
| 6,120,131 A | 9/2000 | Murthy et al. | |
| 6,150,456 A | 11/2000 | Lee et al. | |
| 6,159,611 A | 12/2000 | Lee et al. | |
| 6,251,732 B1 | 6/2001 | Hsu | |
| 6,319,564 B1 | 11/2001 | Naundorf et al. | |
| 6,417,486 B1 | 7/2002 | Reil et al. | |
| 6,492,075 B1 | 12/2002 | Templeton et al. | |
| 6,657,849 B1 | 12/2003 | Andresakis et al. | |
| 6,696,173 B1 | 2/2004 | Naundorf et al. | |
| 6,806,034 B1 | 10/2004 | Guggemos et al. | |
| 6,863,936 B2 | 3/2005 | Chen et al. | |
| 7,060,421 B2 | 6/2006 | Naundorf et al. | |
| 7,083,848 B2 | 8/2006 | Kliesch et al. | |
| 7,112,365 B2 | 9/2006 | Kliesch et al. | |
| 7,115,681 B2 | 10/2006 | Shimo-Ohsako et al. | |
| 7,261,944 B2 | 8/2007 | Kliesch et al. | |
| 7,504,150 B2 | 3/2009 | Lee et al. | |
| 2002/0046996 A1 | 4/2002 | Reil et al. | |
| 2002/0076497 A1 | 6/2002 | Chen et al. | |
| 2002/0110674 A1 | 8/2002 | Reil et al. | |
| 2004/0185388 A1 | 9/2004 | Hirai | |
| 2004/0241422 A1 | 12/2004 | Naundorf et al. | |
| 2004/0259040 A1 | 12/2004 | Endo et al. | |
| 2005/0064711 A1 | 3/2005 | Kliesch et al. | |
| 2005/0069689 A1 | 3/2005 | Kliesch et al. | |
| 2005/0089679 A1 | 4/2005 | Ittel et al. | |
| 2005/0163987 A1 | 7/2005 | Kliesch et al. | |
| 2006/0083939 A1 | 4/2006 | Dunbar et al. | |
| 2006/0286364 A1 * | 12/2006 | Lee et al. ........................ 428/323 | |
| 2007/0039754 A1 | 2/2007 | Salama | |
| 2008/0015320 A1 | 1/2008 | Lee et al. | |
| 2009/0017309 A1 | 1/2009 | Lee et al. | |

FOREIGN PATENT DOCUMENTS

| | | |
|---|---|---|
| EP | 0 356 226 A2 | 2/1990 |
| EP | 0 902 048 | 3/1999 |
| EP | 1 130 189 | 9/2001 |
| EP | 1 367 872 A2 | 3/2003 |
| EP | 1 364 984 A1 | 11/2003 |
| EP | 1 480 081 A2 | 11/2004 |
| EP | 1 559 740 | 3/2005 |
| EP | 1 531 657 | 5/2005 |
| EP | 1 650 249 A1 | 4/2006 |
| EP | 1 653 286 A1 | 5/2006 |
| EP | 1 675 131 | 8/2006 |
| EP | 1 734 071 A1 | 12/2006 |
| EP | 1 912 227 | 4/2008 |
| GB | 1 509 946 | 9/1975 |
| GB | 2 072 212 | 9/1981 |
| GB | 2 381 274 A | 4/2003 |
| JP | 58 12392 | 1/1983 |
| WO | WO 2006/113492 A2 | 10/2006 |
| WO | WO 2006/130582 A1 | 12/2006 |

OTHER PUBLICATIONS

U.S. Appl. No. 10/969,430, filed Oct. 20, 2004, Yueh-Ling Lee et al.
U.S. Appl. No. 11/153,176, filed Jun. 15, 2005, Yueh-Ling Lee et al.
U.S. Appl. No. 11/153,206, filed Jun. 15, 2006, Yueh-Ling Lee et al.
U.S. Appl. No. 11/891,129, filed Aug. 9, 2007, Yueh-Ling Lee et al.
U.S. Appl. No. 12/169,186, filed Jul. 8, 2008, Yueh-Ling Lee et al.
Database WPI Week 199414, Thomson Scientific, London, GB: AN 1994-114843 XP002488369 & JP 06 064090 A (Hitachi Chem Co Ltd) Mar. 8, 1994 Abstract paragraph [0012].
Goschenhofer, et al., EP 1 130 189, Sep. 5, 2001, Abstract.
Search Report.

* cited by examiner

COMPOSITIONS AND METHODS FOR CREATING ELECTRONIC CIRCUITRY

FIELD OF THE INVENTION

The present invention relates generally to the manufacture of conductive pathway patterns for printed circuit materials. More particularly, the processes and materials of the present invention are directed to non-lithographic patterning by laser or similar-type energy beam ablation, where the ablation system ultimately results in circuitry features that are relatively free from debris induced over-plating defects (debris relating to the ablation process) and fully additive plating induced over-plating defects.

BACKGROUND OF THE INVENTION

Printed circuit boards (PCBs) typically comprise an insulating substrate (e.g., glass fiber reinforced epoxy or polyimide film) which supports a thin conducting layer (usually copper) in a pattern designed for a specific application. The patterned conducting layer (also referred to as a printed circuit), is the means for carrying electrical voltages and currents between various electrical components, such as resistors, capacitors, integrated circuits and other electronic devices. Typically, the circuit pattern (i.e. wiring configuration) is produced by a photolithography process that tends to be rather complex and costly. It would thus be advantageous if the image data could more simply and/or more economically transferred onto a circuit board using an alternative, non-lithographic process.

During the process of laser patterning of circuit boards with activatable fillers, debris is generated from ablation during the patterning process. Some of the debris is deposited on the surface of the dielectric or insulating substrate. During the plating step, the activated debris on the surface will be metallized. The varied size of the conductive features can contribute to under-plating or over-plated for a given plating time. Over-plating can occur resulting in traces or paths that are not clean.

A need exists for eliminating over-plating in the lines and spaces. Over-plating can allow charge to flow along a different path than the one intended causing a short.

SUMMARY OF THE INVENTION

The present invention is directed to a printed circuit board precursor having an insulating substrate and a cover layer. The insulating substrate contains an insulating polymeric matrix material. The insulating polymeric matrix material comprises one or more of the following:
  polyimide,
  glass fiber reinforced epoxy,
  phenol-formaldehyde,
  epoxy resin,
  silica filled epoxy,
  bismaleimide resin,
  bismaleimide triazine,
  fluoropolymer,
  polyester,
  polyphenylene oxide/polyphenylene ether resin,
  polybutadiene/polyisoprene crosslinkable resin and copolymers
  thereof, liquid crystal polymer,
  polyamide,
  cyanate ester,
  alumina,
  silica, and
  any combination of the foregoing.

The insulating material further comprises a metal oxide activatable filler. The activatable filler is present in the matrix material in an amount between 3 and 60 weight percent and has an average size in at least one dimension of from 50 to 10000 nanometers. The printed circuit board precursor cover layer has a thickness between and including: 0.5 to 500 microns. The cover layer is chosen from a permanent cover layer, sacrificial cover layer and a strippable cover layer. A permanent cover layer can be used in combination with a sacrificial cover layer.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
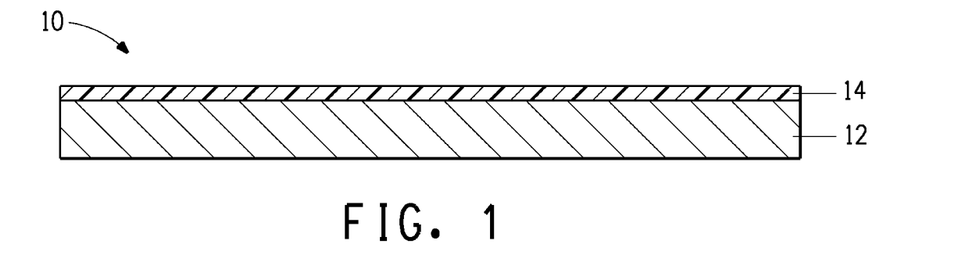
FIG. 1 is a cross-sectional drawing of a portion of a blank printed circuit board precursor according to the present invention prior to laser ablation.

The present invention is directed to cover layers compositions for producing clean circuitry features. Referring now to the drawings, FIG. 1 illustrates one embodiment of the present invention, a printed circuit board ("PCB") precursor 10. The PCB comprises a cover layer 14 and an insulating substrate 12 comprising an insulating matrix material and an activatable filler. A cover layer 14 is located over the insulating substrate.

Insulating substrate 12 comprises activatable filler interspersed within the insulating matrix material. In one embodiment, filler comprises two or more metal oxide cluster configurations within a definable crystal formation. The overall crystal formation, when in an ideal (i.e., non-contaminated, non-derivative) state, has the following general formula:

$$AB_2O_4$$

Where:
i. A is a metal cation having a valance of 2, selected from a group including cadmium, chromium, manganese, nickel, zinc, copper, cobalt, iron, magnesium, tin, titanium, and combinations thereof, which provides a primary cation component of a first metal oxide cluster ("metal oxide cluster 1") typically a tetrahedral structure, ii. B is a metal cation having a valance of 3, selected from a group including chromium, iron, aluminum, nickel, manganese, tin, and combinations thereof, which provides a primary cation component of a second metal oxide cluster ("metal oxide cluster 2") typically an octahedral structure, iii. where within the above groups A or B, any metal cation having a possible valence of 2 can be used as an "A", and any metal cation having a possible valence of 3 can be used as a "B",
iv. where the geometric configuration of "metal oxide cluster 1" (typically a tetrahedral structure) is different from the geometric configuration of "metal oxide cluster 2" (typically an octahedral structure),
v. where a metal cation from A and B can be used as the metal cation of "metal oxide cluster 2" (typically the octahedral structure), as in the case of an 'inverse' spinel-type crystal structure,
vi. where O is oxygen; and
vii. where the "metal oxide cluster 1" and "metal oxide cluster 2" together provide a singular identifiable crystal type structure having heightened susceptibility to electromagnetic radiation evidenced by the following property, when dispersed in a polymer-based dielectric at a loading of about 10 to about 30 weight percent, a "visible-to-infrared light" extinction coefficient can be measure to be between and including any two of the following numbers, 0.05, 0.06, 0.07, 0.08, 0.09, 0.1, 0.2, 0.3, 0.4, 0.5 and 0.6 per micron.

The spinel crystal fillers can be dispersed into a liquid precursor to the matrix material of the insulator substrate 12. Fillers can be dispersed at a weight-percent between and including any two of the following numbers 3, 5, 7, 9, 10, 12, 15, 20, 25, 30, 35, 40, 45, 50, 55 and 60 weight-percent, and initially have an average particle size (after incorporation into the matrix material) of between and including any two of the following numbers 50, 100, 300, 500, 800, 1000, 2000, 3000, 4000, 5000 and 10000 nanometers.

The spinel crystal fillers can be dispersed in an organic solvent (either with or without the aid of a dispersing agent) and in a subsequent step, dispersed in a matrix material solution to form a blended polymer composition. The blended polymer composition can then be cast onto a flat surface (or drum), heated, dried, and cured or semi-cured to form an insulating substrate 12 comprising a matrix with a spinel crystal filler dispersed therein.

The polymer film can then be processed through a light activation step by using a laser beam. The laser beam can be focused, using optical elements, and directed to a portion of the surface of the polymer film where a circuit-trace, or other electrical component, is desired to be disposed. Once selected portions of the surface are light-activated, the light-activated portions can be used as a path (or sometimes a spot) for a circuit trace to be formed later, by a metal plating step for example, an electroless plating step.

The number of processing steps employed to make a circuit using the polymer film or polymer composites are often far fewer relative to the number of steps in the subtractive processes commonly employed in the industry today.

In one embodiment, the insulating substrate compositions and polymer composites have a visible-to-infrared light extinction coefficient of between and including any two of the following numbers 0.05, 0.06, 0.07, 0.08, 0.09, 0.1, 0.2, 0.3, 0.4, 0.5, and 0.6 per micron (or 1/micron). Visible-to-infrared light is used to measure a light extinction coefficient for each film. The thickness of the film is used in the calculations for determining the light extinction coefficient.

As used herein, the visible-to-infrared light extinction coefficient (sometimes referred to herein to simply as 'alpha') is a calculated number.

This calculated number is found by taking the ratio of measured intensity of a specific wavelength of light (using a spectrometer) after placing a sample of the composite film in a light beam path, and dividing that number by the light intensity of the same light through air.

If one takes the natural log of this ratio and multiplies it by (−1), then divides that number by the thickness of the film (measured in microns), a visible-to-infrared light extinction coefficient can be calculated.

The general equation for the visible-to-infrared light extinction coefficient is then represented by the general formula:

$$\text{Alpha} = -1 \times [\ln(I(X)/I(O))]/t$$

where $I(X)$ represents the intensity of light transmitted through a film,
where $I(O)$ represents the intensity of light transmitted through air,
and
where t represents the thickness of a film.

Typically, the film thickness in these calculations is expressed in microns. Thus, the light extinction coefficient (or alpha number) for a particular film is expressed as 1/microns, or inverse microns (e.g., microns$^{-1}$). Particular wavelengths of light useful in the measurements discussed herein are typically those wavelengths of light covering the visible-to-infrared light portion of the spectrum.

The polymer compositions and polymer composites comprise spinel crystal fillers, substantially homogeneously dispersed, in a matrix material solution in an amount within a range between (and including) any two of the following weight-percentages 3, 4, 5, 6, 7, 8, 9, 10, 12, 15, 18, 20, 24, 25, 28, 30, 32, 34, 35, 36, 38, 40, 42, 44, 46, 48, 50, 52, 54, 56, 58 and 60 weight-percent. Polymer composites containing too much spinel crystal filler can sometimes be too brittle to handle in downstream processing as the composites tend to lose flexibility with higher loadings of filler.

In one embodiment, the spinel crystal fillers are represented by the general formula:

$$AB_2O_4$$

where A is a metal cation typically having a valence 2, and is selected from a group comprising cadmium, chromium, manganese, nickel, zinc, copper, cobalt, iron, magnesium, tin, titanium, and combinations of two or more of these, and where B is a metal cation typically having a valence of 3, and is selected from the group comprising chromium, iron, aluminum, nickel, manganese, tin, and combinations of two or more of these, and where O is primarily, if not in all cases, oxygen.

In one embodiment, the metal cation A provides the primary cation component of a first metal oxide cluster, "metal oxide cluster 1" (typically a tetrahedral structure) of a spinel structure. Metal cation B provides the primary cation component of a second metal oxide cluster, "metal oxide cluster 2" (typically an octahedral structure).

In another embodiment, within the above groups A and B, any metal cation having a possible valence of 2 can be used as an "A" cation. In addition, any metal cation having a possible valence of 3 can be used as a "B" cation provided that the geometric configuration of "metal oxide cluster 1" is different from the geometric configuration of "metal oxide cluster 2".

In yet another embodiment, A and B can be used as the metal cation of "metal oxide cluster 2" (typically the octahedral structure). This is true in the particular case of an 'inverse' spinel-type crystal structure typically having the general formula $B(AB)O_4$.

In one or more steps, the insulating substrate matrix material is solvated to a sufficiently low viscosity (typically, a viscosity of less than 50, 40, 30, 20, 15, 10, 9, 8, 7, 6, 5, 4, 3, 2, 1.5, 1, 0.5, 0.1, 0.05, and 0.001 kiloPoise) to allow the spinel crystal filler (which can also be suspendable in a similar or the same solvent) to be adequately dispersed within the matrix material solution. The dispersion of the spinel crystal filler is conducted in such a manner as to avoid undue agglomeration of the particles in the solution or the dispersion. Unwanted agglomeration of the filler particles can cause unwanted interfacial voids, or other problems in the polymer composite.

The spinel crystal filler particles can be dispersed in the insulating substrate matrix material solution directly, or can be dispersed in a solvent prior to dispersion in the insulating substrate matrix material solution. The filler particles can be mixed in a solvent to form a dispersion, until the particles have reached an average particle size of between any two of the following numbers 50, 100, 300, 500, 800, 1000, 2000, 3000, 4000, 5000, and 10000 nanometers. The dispersion may then be mixed using a high-speed, or high-shear, mixing apparatus. Spinel crystal filler may be dispersed using various suitable solvents. In some cases, the dispersions may also include one or more suitable dispersing agents known to a skilled artisan for assistance in forming a stable dispersion, particularly for commercial scale production.

The spinel crystal fillers dispersed in the insulating substrate matrix material solution generally have an average particle size between and including any two of the following numbers 50, 100, 200, 250, 300, 350, 400, 450, 500, 1000, 2000, 3000, 4000, 5000 and 10000 nanometers. Generally, at least 80, 85, 90, 92, 94, 95, 96, 98, 99 or 100 percent of the dispersed spinel crystal filler is within the above size range(s). Crystal size, in the matrix material solution, can be determined by a laser particle analyzer, such as an LS130 particle size analyzer with small volume module made by COULTER®.

The insulating substrate matrix material solution and the spinel crystal filler particles are combined to form a relatively uniform dispersion of the composition. The composition may then be converted as described below into a polymer composite where the solids content is typically greater than 98.0, 98.5, 99.0 or 99.5 weight-percent.

Because some spinel crystal fillers are easily dispersed in a matrix material solution, with little or no additional shearing force required, slurries formed can contain often fewer than 100, 50, 20, 10, 8, 6, 5, 4, 3, 2, or 1 parts per million (ppm) undesired agglomerates. Undesirable agglomerates are defined as a collection of bound (adjoining) spinel crystal fillers having an average particle size of greater than 10, 11, 12, 13, 14, or 15 microns. However, some spinel crystal fillers may require some milling or filtration to break up unwanted particle agglomeration for adequately dispersing nano-sized fillers into a polymer. Milling and filtration can be costly, and may not satisfactorily remove all unwanted agglomerates. Thus, in one embodiment, the spinel crystal filler is dispersible, and suspendable, at 20 weight-percent in a (at least 99 weight-percent pure) dimethylacetamide solvent. After dispersing and suspending the spinel crystal filler into a solvent (optionally with the aid of a high-shear mechanical mixer) less than 15, 10, 8, 6, 4, 2 or 1 weight-percent of the filler particles by weight can precipitate out of solution when the solution was kept at rest for 72 hours at 20° C.

The present invention employs the use of a selected group of spinel crystal fillers to allow for efficient and accurate surface patterning through activation by a laser (or other similar type light patterning technique) prior to bulk metallization of the pattern formed by the laser.

In one embodiment, a light extinction coefficient modifier can be added as a partial substitute for some, but not all, of the spinel crystal filler. Appropriate amounts of substitution can range from, between and including any two of the following numbers, 1, 2, 3, 4, 5, 10, 15, 20, 25, 30, 35, or 40 weight percent of the total amount of spinel crystal filler component. In one embodiment, about 10 weight percent of the spinel crystal filler can be substituted with a carbon powder or graphite powder. The polymer composite formed therefrom should have a sufficient amount of spinel crystal structure present in the polymer composite to allow metal ions to plate effectively on the surface thereof, while the above mentioned amount of substitute (e.g., carbon powder) darkens the polymer composite sufficiently enough so that the a sufficient amount of light energy (i.e., an amount of light energy that effectively light activates the surface of the composite) can be absorbed.

A specific range of useful light extinction coefficients has been advantageously found for the polymer compositions and polymer composites. Specifically, it was found that the polymer compositions and polymer composites require a sufficient degree of light-absorption capability to work effectively in high-speed light activation steps typically employing the use of certain laser machines.

For example, in one type of light-activation step employed (e.g., a step employing the use of a laser beam) it was found that the polymer compositions and composites of the present invention are capable of absorbing a significant amount of light energy so that a well-defined circuit trace pattern can be formed thereon. This can be done in a relatively short time. Conversely, commercially available polymer films (i.e., films without these particular fillers, or films containing non-functional spinel crystal fillers) may take longer, have too low a light extinction coefficient, and may not be capable of light-activating in a relatively short period, if at all. Thus, many polymer films, even films containing relatively high loadings of other types of spinel crystal fillers, may be incapable of absorbing enough light energy to be useful in high-speed, light activation manufacturing, as well as being able to receive plating of a metal in well-defined circuit patterns.

In some embodiments, the insulating matrix material is selected from polyimide, glass fiber reinforced epoxy, phenol-formaldehyde, epoxy resin, silica filled epoxy, bismaleimide resin, bismaleimide triazine, fluoropolymer, polyester, polyphenylene oxide/polyphenylene ether resin, polybutadiene/polyisoprene crosslinkable resin (and copolymers), liquid crystal polymer, polyamide, cyanate ester, or any combination of the foregoing thereof or any other insulating matrix materials known and used in the circuit board industry, and of any thickness deemed useful to the industry. In some embodiments, the insulating substrate matrix material may include an additive such as, non-conductive fillers, pigments, viscosity modifiers, and other common additives known in the art.

In some embodiments, the insulating substrate contains a laser dye present between and including 1, 2, 4, 6, 10, 12, 14, 16, 18 and 20 weight percent.

Useful organic solvents for the preparation of the insulating substrate matrix materials of the invention should be capable of dissolving the insulating substrate matrix materials. A suitable solvent should also have a suitable boiling point, for example, below 225° C., so the polymer solution can be dried at moderate (i.e., more convenient and less costly) temperatures. A boiling point of less than 210, 205, 200, 195, 190, 180, 170, 160, 150, 140, 130, 120 or 110° C. is suitable.

Epoxy resins are thermoplastic materials which can be cured to a thermoset polymer. Major resin types include diglycidyl ethers of bisphenol A, novolacs, peracid resins, and hydantoin resins, among others. There are many epoxy resin suppliers in the world and the most recognizable trade names include Araldite, DER, Epi-Cure, Epi-Res, Epikote, Epon, Epotuf, each of which provide a wide range of properties depending on the formulation and processing. Additional components may also be added to an epoxy resin and curing agent formulation. These components include, but are not limited to, diluents, resinous modifiers to affect flexibility, toughness or peel strength, adhesion fillers, colorants, dyes, rheological additives, and flame retardants.

In one embodiment, the insulating substrate matrix material may include an epoxy resin. Examples of suitable epoxy resins, include, but are not limited to, glycidyl ether type epoxy resin, glycidyl ester resin and glycidylamine type epoxy resin. In addition, any silica or alumina-filled epoxies are also suitable.

Examples of suitable glycidyl ether type epoxy resins include, but are not limited to: bisphenol A type, bisphenol F type, brominated bisphenol A type, hydrogenated bisphenol A type, bisphenol S type, bisphenol AF type, biphenyl type, naphthalene type, fluorene type, phenol novolac type, cresol novolac type, DPP novolac type, trifunctional type, tris(hydroxyphenyl)methane type, and tetraphenylolethane type epoxy resins.

Examples of suitable glycidyl ester type epoxy resins include, but are not limited to: hexahydrophthalate type and phthalate type epoxy resins.

Examples of suitable glycidylamine type epoxy resins include, but are not limited to: tetraglycidyldiaminodiphenylmethane, triglycidyl isocyanurate, hydantoin type, 1,3-bis(N, N-diglycidylaminomethyl) cyclohexane, aminophenol type, aniline type, and toluidine type epoxy resins.

In one embodiment, the matrix material may include a polyester. Examples of suitable polyesters include, but are not limited to: polyethylene terephthalate, polybutylene terephthalate, poly(trimethylene)terephthalate, etc., poly(e-caprolactone), polycarbonate, poly(ethylene-2,6-naphthalate), poly(glycolic acid), poly(4-hydroxy benzoic acid)-co-poly(ethyleneterephthalate) (PHBA), and poly(hydroxybutyrate).

In another embodiment, the insulating substrate matrix material may include a polyamide. Examples of suitable aliphatic polyamides include, but are not limited to: nylon 6, nylon 6,6, nylon 6,10 and nylon 6,12, nylon 3, nylon 4,6 and copolymers thereof are useful with this invention. Examples of aliphatic aromatic polyamides include, but are not limited to, nylon 6T (or nylon 6(3)T), nylon 10T and copolymers thereof, nylon 11, nylon 12 and nylon MXD6 are also suitable for use with this invention. Examples of aromatic polyamides include, but are not limited to, poly(p-phenylene terephthalamide), poly(p-benzamide), and poly(m-phenylene isophthalamide) are also suitable for use with this invention.

In another embodiment, the insulating substrate matrix material may include a fluoropolymer. The term fluoropolymer is intended to mean any polymer having at least one, if not more, fluorine atoms contained within the repeating unit of the polymer structure. The term fluoropolymer, or fluoropolymer component, is also intended to mean a fluoropolymer resin (i.e. a fluoro-resin). Commonly, fluoropolymers are polymeric material containing fluorine atoms covalently bonded to, or with, the repeating molecule of the polymer. Suitable fluoropolymer components include, but are not limited to:

1. "PFA", a poly(tetrafluoroethylene-co-perfluoro[alkyl vinyl ether]), including variations or derivatives thereof, having the following moiety representing at least 50, 60, 70, 80, 85, 90, 95, 96, 97, 98, 99 or about 100 weight percent of the entire polymer:

where $R_1$ is $C_nF_{2n+1}$, where n can be any natural number equal to or greater than 1 including up to 20 or more, typically n is equal to 1 to three, where x and y are mole fractions, where x is in a range from 0.95 to 0.99, typically 0.97, and where y is in a range from 0.01 to 0.05, typically 0.03, and where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.).

2. "FEP", a poly(tetrafluoroethylene-co-hexafluoropropylene) [a.k.a. poly(tetrafluoroethylene-co-hexafluoropropylene) copolymer], derived in whole or in part from tetrafluoroethylene and hexafluoropropylene, including variations or derivatives thereof, having the following moiety representing at least 50, 60, 70, 80, 85, 90, 95, 96, 97, 98, 99 or about 100 weight percent of the entire polymer:

where x and y are mole fractions, where x is in a range from 0.85 to 0.95, typically 0.92, and where y is in a range from 0.05 to 0.15, typically 0.08, and where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.). The FEP copolymer can be derived directly or indirectly from: (i.) 50, 55, 60, 65, 70 or 75 percent to about 75, 80, 85, 90 or 95 percent tetrafluoroethylene; and (ii.) 5, 10, 15, 20, or 25 percent to about 25, 30, 35, 40, 45 or 50 percent (generally 7 to 27 percent) hexafluoropropylene. Such FEP copolymers are well known and are described in U.S. Pat. Nos. 2,833,686 and 2,946,763.

3. "PTFE", a polytetrafluoroethylene, including variations or derivatives thereof, derived in whole or in part from tetrafluoroethylene and having the following moiety representing at least 50, 60, 70, 80, 85, 90, 95, 96, 97, 98, 99 or about 100 weight percent of the entire polymer: where x is equal to any natural number between 50 and 500,000.

4. "ETFE", a poly(ethylene-co-tetrafluoroethylene), including variations or derivatives thereof, derived in whole or in part from ethylene and tetrafluoroethylene and having the following moiety representing at least 50, 60, 70, 80, 85, 90, 95, 96, 97, 98, 99, or about 100 weight percent of the entire polymer:

where x and y are mole fractions, where x is in a range from 0.40 to 0.60, typically 0.50, and where y is in a range from 0.40 to 0.60, typically 0.50, and where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.).

Advantageous characteristics of fluoropolymer resins include high-temperature stability, resistance to chemical attack, advantageous electrical properties (high-frequency properties in particular) low friction properties, and low tackiness. Other potentially useful fluoropolymer resins include the following:

1. chlorotrifluoroethylene polymer (CTFE);
2. tetrafluoroethylene chlorotrifluoroethylene copolymer (TFE/CTFE);
3. ethylene chlorotrifluoroethylene copolymer (ECTFE);
4. polyvinylidene fluoride (PVDF);
5. polyvinylfluoride (PVF); and
6. Teflon® AF (sold by E.I. du Pont de Nemours & Co.).

In yet another embodiment, the insulating substrate matrix material may include a liquid crystal polymer or thermotropic liquid crystal polymer. Liquid crystal polymers generally include a fusible or melt processible polyamide or polyester. Liquid crystal polymers also include, but are not limited to, polyesteramides, polyesterimides, and polyazomethines. Suitable liquid crystal polymers are described by Jackson et al. in U.S. Pat. Nos. 4,169,933, 4,242,496 and 4,238,600, as well as in "Liquid Crystal Polymers VI: Liquid Crystalline Polyesters of Substituted Hydroquinones." The term "thermotropic" means a polymer that when tested by the TOT test as described in U.S. Pat. No. 4,075,262 transmits light through crossed polarizers and is thus considered to form an anisotropic melt. Suitable liquid crystal polymers are described, for example in U.S. Pat. Nos. 3,991,013; 3,991,014; 4,011,199; 4,048,148; 4,075,262; 4,083,829; 4,118,372; 4,122,070; 4,130,545; 4,153,779; 4,159,365; 4,161,470; 4,169,933; 4,184,996; 4,189,549; 4,219,461; 4,232,143; 4,232,144; 4,245,082; 4,256,624; 4,269,965; 4,272,625; 4,370,466; 4,383,105; 4,447,592; 4,522,974; 4,617,369; 4,664,972; 4,684,712; 4,727,129; 4,727,131; 4,728,714; 4,749,769; 4,762,907; 4,778,927; 4,816,555; 4,849,499; 4,851,496; 4,851,497; 4,857,626; 4,864,013; 4,868,278; 4,882,410; 4,923,947; 4,999,416; 5,015,721; 5,015,722; 5,025,082; 5,1086,158; 5,102,935; 5,110,896 and U.S. Pat. No. 5,143,956; and European Patent Application 356,226. Commercial examples of liquid crystal polymers include the aromatic polyesters or poly(ester-amides) sold under the trademarks Zenite® (DuPont), VECTRA® (Hoechst), and XYDAR® (Amoco).

Figure 2:
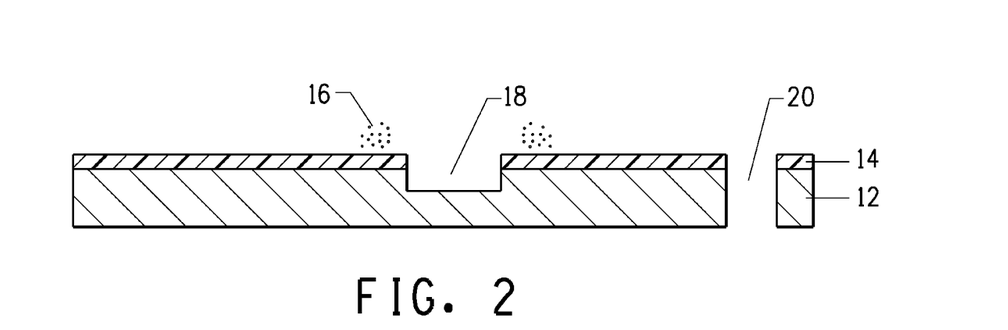
FIG. 2 is a cross-sectional drawing similar to that of FIG. 1, illustrating a process of ablating a pattern on the board.

Referring now to FIG. 2, insulating substrate 12 lies under a cover layer 14 which functions as a protective layer upon which ablation debris 16 will tend to locate as the laser (or similar type energy source) ablates through cover layer 14 and into insulating substrate 12. The laser ablation process tends to act somewhat like a plowing process, cutting a trough 18 or a via 20.

In one embodiment, the cover layer 14 is a sacrificial layer. The sacrificial cover layer removes laser generated activated debris. The sacrificial cover layer is removed prior to metallization, thus removing any activated debris before the debris is metallized in the plating bath.

In this embodiment during laser ablation, mounds of debris 16 will form along the top edges of the cover layer trough 18. Laser ablation debris will tend to comprise insulating substrate material, and the activatable filler within the insulating substrate debris 16 will tend to become activated due to the laser ablation process. Such activated filler at the surface of the debris 16 will tend to act as a metallization primer during metallization, causing metal to form upon the debris as the laser ablated trough (or via) is filled with metal during metallization. Metallization of the ablation debris is generally undesirable and can lead to problems in electrical performance and/or reliability of the final printed wiring board product.

In some embodiments, the sacrificial cover layer matrix material is selected from the group consisting of polyacryamide, polyglycol polyethylene glycol, polyethylene oxide, polyvinyl pyrrolydinone, polyacrylic acid, polymethacrylic acid, polymaleic acid, and mixtures thereof. In some embodiments the sacrificial cover layer matrix material is present between and including 80, 85, 90, 95 and 100 weight percent.

In some embodiments, the sacrificial cover layer is soluble in water, dilute alkali, weak acid solution and organic solvents. This solvent does not necessarily dissolve the entire cover layer, but may just be active enough to penetrate underneath the layer and to thus destroy its adhesion to the underlying insulating substrate, whereupon cover layer 14 is just swept away. Regardless, the wash solution should be selected for its ability to dissolve or otherwise remove the cover layer.

In some embodiments, the sacrificial cover layer has a thickness between and including 0.5, 1, 5, 10, 15, 20, 25, 30, 35, 40, 45, 50, 55, 60, 65, 70, 75, 80, 85, 90, 95 and 100 microns.

Figure 3:
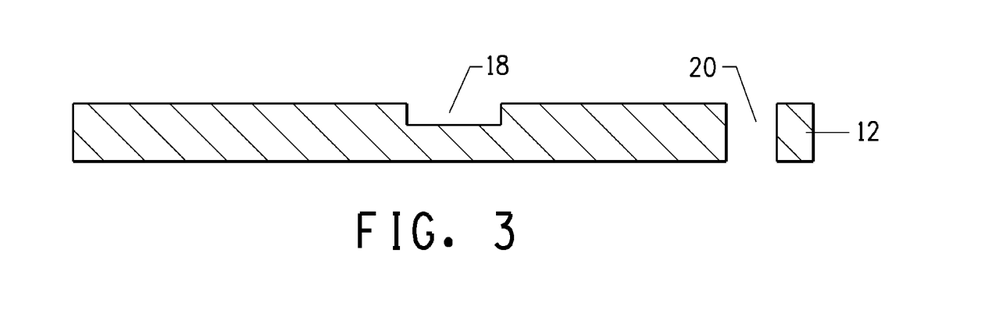
FIG. 3 is a cross-sectional drawings similar to that of FIG. 2, illustrating a process of removing the sacrificial cover layer prior to metallization.

Ideally in such embodiments, metallization should occur largely, if not exclusively, within the laser ablated trough 18 or via 20 defined by the insulating substrate 12. Referring now to FIG. 3, in one embodiment the cover layer can be removed after laser ablation and prior to metallization. In such embodiments, once the cover layer is removed, the ablated insulating substrate layer is exposed and is substantially, if not wholly, free of ablation debris at the insulation layer surface. In such embodiments, metallization will tend to build upon the surface of the trough 18 or via 20. since the laser ablation process will activate the filler at the ablated surfaces, thereby creating a metallization primer at the walls of the insulation layer trough (or via) and fill the trough (or via) without undue metallization outside the trough (or via).

In another embodiment, the cover layer 14 is a strippable layer. The strippable cover layer removes laser generated activated debris and controls any over-plating. The strippable cover layer can withstand a solvent with a ph greater than 7 and is soluble in solvent with a ph less than 7. The strippable cover is capable of withstanding the alkaline clean bath and electroless plating bath. The strippable cover layer can be removed after metallization. The strippable cover layer removes any over-plating and debris which has been metallized and partially removes or confines over-plating to provide cleaner circuitry features. The term "Over-plating" refers to the excess metal build up laterally and upwardly of the conductor features such as vias, traces, pads etc. and the spaces on the circuitry. The excessive metal build-up on of conductive features can cause shorts. An additional debris removal process after laser imaging is optional. Pressure sensitive adhesive tapes can be laminated on the substrate to remove debris for this additional cleaning process. Rubber rollers can also be applied to lift debris from the imaged substrate with the assistance of pressure sensitive adhesive coatings.

Figure 4A:
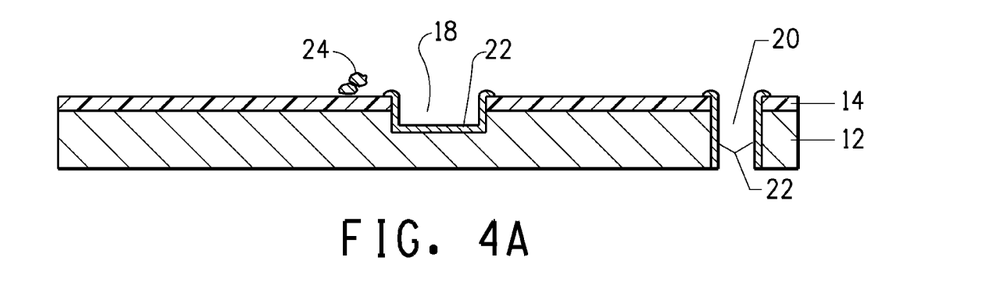
FIG. 4 is a cross-sectional drawings similar to that of FIG. 2, illustrating a process of metallizing prior to removal of the strippable cover layer.
Figure 4B:
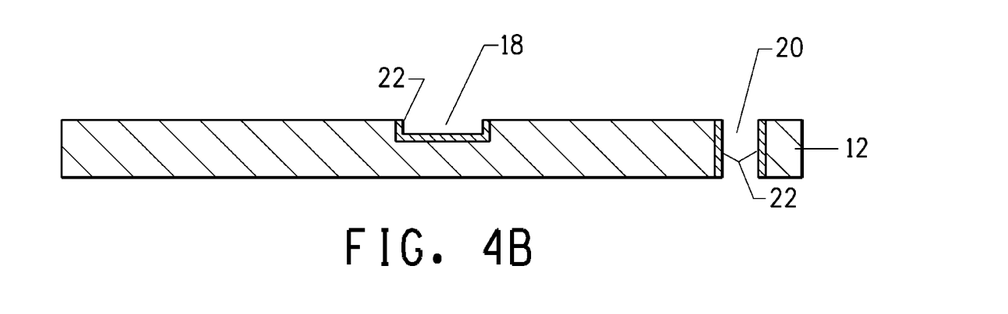

Referring now to FIG. 4, in other embodiments, the cover layer 14 can be kept until after metallization 22, then removed. In such embodiments, the metallization pattern will tend to have very clean, sharp metallization lines at the trough (or via) edge, and very little, if any, unwanted metallization outside the ablated trough (or via).

In some embodiments, the strippable cover layer matrix material is selected from the group consisting of chitosan, methylglycol chitosan, chitosan oligosaccharide lactate, glycol chitosan, poly(vinyl imidazole) polyallylamine, polyvinylamine, polyetheramine, cyclen(cyclic polyamine), polyethylene amine(linear, or branched, or benzylated), poly(N-methylvinylamine), polyoxyethylene bis(amine) N'-(4-Benzyloxy)-N,N-dimethylformamidine polymer-bound (amidine resin), poly(ethylene glycol)bis(2-aminoethyl), poly(2-vinylpyridine), poly(4-vinylpyridine), poly(2-vinylpyridine N-oxide), poly(4-vinylpyridine N-oxide), poly(4-vinylpyridine-co-divinylbenzene), poly(2-vinylpyridine-co-styrene), poly(4-vinylpyridine-co-styrene), poly(4-vinylpyridine)-2% crosslinked, poly(4-aminostyrene), poly(aminomethyl)polystyrene, poly(dimethylaminoethylmethacrylate), poly(tbutylaminotheylmethacrylate), poly(dimethylaminoethylmethacrylate), poly(aminoethylmethacrylate), copolymer of styrene and dimethylaminopropylamine maleimide: and mixtures thereof. The polymers are not limited by molecular weight and monomer ratios.

In some embodiments, the strippable cover layer is soluble in water or weak acid water mixtures. In some embodiments, the strippable cover layer is soluble in organic solvents. The term "soluble" is intended to mean the ability to be removed by the action of a liquid. The liquid does not necessarily completely dissolve the entire cover layer, but may just be active enough to penetrate underneath the layer and to thus destroy its adhesion to the underlying insulating substrate, whereupon cover layer is just swept away. Regardless, the wash solution should be selected for its ability to dissolve or otherwise remove the cover layer.

In some embodiments, the strippable cover layer has a thickness between and including 2, 5, 10, 50, 100, 150, 200, 250, 300, 350, 400, 450 and 500 microns.

In embodiments where the cover layer is used as a strippable layer and removed either before or after metallization, the metallization chemistry and metallization processing can be adjusted or fine tuned so that metallization substantially stops where intended, such as, at the surface of the trough or extending as a mound beyond the trough upper surface.

In yet another embodiment, the cover layer 14 is a permanent layer. The permanent cover layer refers to a layer that is not removed before or after plating. The permanent cover layer reduces the amount of over-plating and provides cleaner circuitry features. In another embodiment, a sacrificial cover layer is used in combination with the permanent cover layer.

Figure 5:
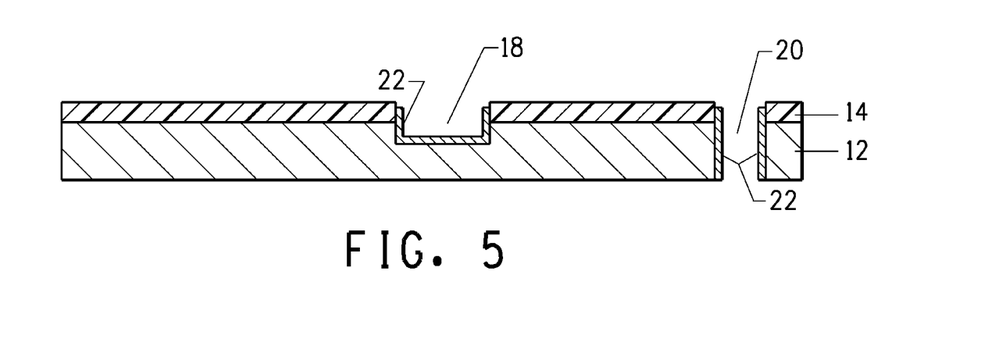
FIG. 5 is a cross-sectional drawings similar to that of FIG. 2, illustrating a process of utilizing a permanent cover layer, rather than a sacrificial cover layer

Referring now to FIG. 5, in an alternative embodiment the cover layer 14 is a permanent cover layer. In such embodiments, the cover layer remains and becomes part of the final printed wiring board product. The cover layer can be a permanent layer if the desired metal within the insulation substrate 12 trough 18 is sufficiently separated from any metallized debris or if the cover layer sufficiently protects the metallized 22 trough 18 from any defects or problems that might otherwise be caused by the debris. One advantage of a permanent cover layer is that the metallization that fills the trough can more easily be kept below the topmost surface reducing over-plating.

In some embodiments, the permanent cover layer matrix material is selected from the group consisting of polyimide, glass fiber reinforced epoxy, phenol-formaldehyde, epoxy resin, silica filled epoxy, bismaleimide resin, bismaleimide triazine, fluoropolymer, polyester, polyphenylene oxide/polyphenylene ether resin, polybutadiene/polyisoprene crosslinkable resin and copolymers thereof, liquid crystal polymer, polyamide, cyanate ester, alumina,silica, and mixtures thereof.

In some embodiments, the cover layers are used individually with the insulating substrate. In some embodiments, the sacrificial and strippable cover layers may be used in combination with the insulating substrate with the insulating substrate as the bottom layer, the strippable cover layer in the middle, and the sacrificial cover layer as the top layer. In some embodiments, the permanent and sacrificial cover layers may be used in combination with the insulating substrate with the insulating substrate as the bottom layer, the permanent cover layer in the middle, and the sacrificial cover layer as the top layer.

In some embodiments, the sacrificial cover layer contains a laser dye. In some embodiments, the strippable cover layer contains a laser dye. In some embodiments permanent cover layer contains a laser dye. In some embodiments the insulating substrate contains a laser dye. In some embodiments, any one of the cover layers, used individually or in combination, and the insulating substrate both contain a laser dye. In some embodiments, the laser dye is present between and including 1, 2, 4, 6, 10, 12, 14, 16, 18 and 20 weight percent. In some embodiments the laser dye has an absorption peak including and between 200, 300, 400,500, 600, 700, 800, 900, 1000, 1100 nm. A laser dye accelerates the absorption of laser radiation due to its absorption peak close to the wave number of the laser used. The addition of laser dyes can promote photodecomposition and control thermal dissipation. As a result, the laser imaged trench will have high resolution with well defined geometry and sharp edge.

In some embodiments the laser dye for a UV laser is selected from Stilbene 420: 2,3"-([1,1'-biphenyl]-4,4'-diyldi-2,1-ethenediyl)bisbenzenesulfonic acid disodium salt, Carbostyril 165: 7-dimethylamino-4-methylcarbostyril, Coumarin 450: 7-(ethylamino)-4,6-dimentyl-2H,-1-benzopyran-2-one), Coumarin 445: 7-(ethylamino)-4-mentyl-2H,-1-benzopyran-2-one), Coumarin 440: 7-amino-4-mentyl-2H,-1-benzopyran-2-one), Coumarin 460: 7-(ethylamino)-4-mentyl-2H,-1-benzopyran-2-one), Coumarin 481: 7-(diethylamino)-4-(trifluoromethyl)-2H,-1-benzopyran-2-one), Coumarin 487, Coumarin 500: 7-(ethylamino)-4-(trifluoromethyl)-2H,-1-benzopyran-2-one), Coumarin 503: 7-(ethylamino)-6-(trifluoromethyl)-2H,-1-benzopyran-2-one), BPBD-365, 2-[1,1'-biphenyl]-4-yl-5-[4-(1,1-dimentylethyl)phenyl]-1,2,4-oxadiazole, PBD, 2-[1,1'-biphenyl]-4-yl-5-phenyl]-1,3,4-oxadiazole, PPO, 2-5-diphenyloxadiazole, QUI, 3,5,3"",5""-tetra-t-butyl-p-quinquephenyl, BBQ,4,4""-bis[(2-butyloctyl)oxy]-1,1'4',1",4",1""-quaterphenyl, 2-(1-naphthyl)-5-phenyl-oxazole, PBBO, 2-[1,1'-biphenyl]4-yl-6-phenyl-benzoxazole, DPS, 4,4"-(1,2,-ethenediyl)bis-1,1'-biphenyl, POPOP, 2,2'-(1,4,-phenylene)bis[5-phenyl-oxazole], Bis-MSB, 1,4-bis[2-(2-methylphenyl)ethenyl]-benzene, 5-Phenyl-2-(4-pyridyl)oxazole, 4-methyl-7-(4-morpholinyl)-2H-pyrano[2,3-b]pyridine-2-one, 7-(diethylamino-2H-1-benzopyran-2-one, 7-(dimethylamino)-4-methoxy-1,8-naphthyridin-2(1H)-one, 1,2,3,8-tetrahydo-1,2,3,3,8-pentamethyl-5-(trifluoromethyl)-7H-pyrrolo[3,2-g]quinoolin-7-one, 6,7,8,9-tetrahydo-6,8,9-trimethyl-4-(trifluoromethyl)-2H-pyrrolo[3,2-b][1,8]naphthyridin-2-one, 7-Amino-4-methyl-2(1H)-quinolinone, 2,3,6,7-tetrahydo-1H,5H,1,1H-[1]benzopyrrano[6,7,8-ii]-quinoliz-11-one, EXALITE 376, EXALITE 384, EXALITE 389, EXALITE 392A, EXALITE 398, EXALITE 404, EXALITE 411, EXALITE 416, EXALITE 417, EXALITE 428, EXALITE 392E , EXALITE 400E, EXALITE 377E and mixtures thereof.

In another embodiment, the laser dye for an excimer laser is selected from p-terphenyl, 1,1',4',1'-terphenyl, 2",3,3",3""-tetramethyl-1,1,4',1",4",1""-quaterphenyl, 2-methyl-5-t-butyl-p-quaterphenyl, EXALITE 348, EXALITE 351

EXALITE 360: 2,3,2''',5'''-tetramethyl-p-quaterphenyl, P-Quaterphenyl, 1,1'4',1'',4'',1'''-quaterphenyl and mixtures thereof.

In yet another embodiment, the laser dye for a IR laser is selected from 8-[[3-[(6,7-Dihydro-2,4-diphenyl-5H-1-benzopyran-8-yl)methylene]-2-phenyl-1-cyclohexen-1-yl]methylene]-5,6,7,8-tetrahydro-2,4-diphenyl-1-benzopyrylium tetrafluoroborate (IR-1100), 4-[2-[2-Chloro-3-[(2,6-diphenyl-4H-thiopyran-4-ylidene)ethylidene]-1-cyclohexen-1-yl]ethenyl]-2,6-diphenylthiopyrylium tetrafluoroborate (IR-1061), 1-Butyl-2-[2-[3-[(1-butyl-6-chlorobenz[cd]indol-2(1H)-ylidene)ethylidene]-2-chloro-5-methyl-1-cyclohexen-1-yl]ethenyl]-6-chlorobenz[cd]indolium tetrafluoroborate (IR-1050), 1-Butyl-2-[2-[3-[(1-butyl-6-chlorobenz[cd]indol-2(1H)-ylidene)ethylidene]-2-chloro-1-cyclohexen-1-yl]ethenyl]-6-chlorobenz[cd]indolium tetrafluoroborate (IR-1048), 4-[2-[3-[(2,6-Diphenyl-4H-thiopyran-4-ylidene)ethylidene]-2-phenyl-1-cyclohexen-1-yl]ethenyl]-2,6-diphenylthiopyrylium tetrafluoroborate (IR-1040), 4-[2-[2-Chloro-3-[(2-phenyl-4H-1-benzopyran-4-ylidene)ethylidene]-1-cyclohexen-1-yl]ethenyl]-2-phenyl-1-benzopyrylium (IR-27), 4-(7-(2-phenyl-4H-1-benzothiopyran-4-ylidene)-4-chloro-3,5-trimethylene-1,3,5-heptatrienyl)-2-phenyl-1-benzothiopyrylium perchlorate (IR 26), 3-ethyl-2[[3-[3-[(3-ethyl-2(3H)-benzothiazolylidene)methyl]5,5-dimethyl-2-cyclohexen-1-ylidene]-1-propenyl]-5,5-dimethyl-2-cyclohexen-1-ylidene]methyl]-benzothiazolium perchlorate (DNTPC-P), 3-ethyl-2[[3-[3-[(3-ethylnaphthol[2,1-d]thiazol-2(3H)-ylidene)methyl]-5,5-dimehtyl-2-cyclohexen-1-ylidene]-1-propenyl]-5,5-dimethyl-2-cyclohexen-1-ylidene]methyl]naphtha[2,1-d]thiazolium perchlorate (DNDTPC-P) and mixtures thereof In yet another embodiment, the laser dye for a 2×YAG LASER is selected from Fluorol 555, LDS 698, DCM, LDS 722, Disodium Fluorescein, Rhodamine 560, Fluorescein, LDS 821, LD 688, Pyrromethene 567, 1,3,5,7,8-pentamethyl-2,6-diethylpyrromethene-difluoroborate comples, Rhodamine 575, Pyrromethene 580, Pyrromethene 597, LDS 720, LDS 751, styril 8, Rhodamine 590, Rhodamine 610, LDS 759, LDS 798, Pyrromethene 605, 8-acetoxymethyl-2,6-diethyl-1,3,5,7-tetramethyl pyrromethene fluoroborate, LDS 750, Rhodamine 640 Per, Sulforhodamine 640, DODC Iodide, Kiton Red 620, LDS 925, Pyrromethene 650, LDS 765, LDS 730, LDS 867, 1,1'-Diethyl-2,2'-dicarbocyanine iodide, LD 690 perchlorate, 1,1'-Diethyl-4,4'-carbocyanine iodide, Cresyl Violet 670, 5-imino-5H-benzo[a]phenoxazin-9-amine monoperchlorate, 3,3' Diethylthiadicarbocyanine iodide, 1,3-Bis[4-(dimethylamino)-2-hydroxyphenyl]-2,4-dihydroxycyclobutenediylium dihydroxide, bis(inner salt), Propyl Astra Blue Iodide, iodide 1,1',3,3,3',3'-Hexamethyl-4,5,4',5'-dibenzoindodicarbocyanine (IR-676) and mixture thereof.

In yet another embodiment, the laser dye for a GaAs laser is selected from 5,5'-Dichloro-11-diphenylamino-3,3'-diethyl-10,12-ethylenethiatricarbocyanine perchlorate (IR-140), 1,1',3,3,3',3'-Hexamethylindotricarbocyanine, 1,1',3,3,3',3'-Hexamethylindotricarbocyanine iodide, 1,1'-Diethyl-2,2'-quinotricarbocyanine iodide, Bis[5-[[4-(dimethylamino)phenyl]imino]-8(5H)-quinolinone]nickel(II), 2,4-Di-3-guaiazulenyl-1,3-dihydroxycyclobutenediylium dihydroxide bis(inner salt), 3,3'-Diethylthiatricarbocyanine iodide, 3,3'-Diethylthiatricarbocyanine perchlorate Dimethyl{-[1,5,5-tris(4-dimethylaminophenyl)-2,4-pentadienylidene]-2,5-cyclohexadien-1-ylidene}ammonium perchlorate (IR-800), 1,1'-Diethyl-4,4'-dicarbocyanine iodide, HITC, Dimethyl{4-[1,7,7-tris(4-dimethylaminophenyl)-2,4,6-heptatrienylidene]-2,5-cyclohexadien-1-ylidene}ammonium perchlorate (IR-895), [2-[2-Chloro-3-[[1,3-dihydro-1,1-dimethyl-3-(4-sulfobutyl)-2H-benzo[e]indol-2-ylidene]-ethylidene]-1-cyclohexen-1-yl]-ethenyl]-1,1-dimethyl-3-(4-sulfobutyl)-1H-benzo[e]indolium hydroxide inner salt (IR-820), Naphthol Green B, 2-[2-[2-Chloro-3-[2-[1,3-dihydro-3,3-dimethyl-1-(4-sulfobutyl)-2H-indol-2-ylidene]-ethylidene]-1-cyclohexen-1-yl]-ethenyl]-3,3-dimethyl-1-(4-sulfobutyl)-3H-indolium hydroxide (IR-783), 2-[2-[2-Chloro-3-[2-(1,3-dihydro-1,3,3-trimethyl-2H-indo]-2-ylidene)-ethylidene]-1-cyclohexen-1-yl]-ethenyl]-1,3,3-trimethyl-3H-indolium chloride (IR-775 chloride), 2-[7-[1,3-Dihydro-3,3-dimethyl-1-(4-sulfobutyl)-2H-indol-2-ylidene]-hepta-1,3,5-trienyl]-3,3-dimethyl-1-(4-sulfobutyl)-3H-indolium hydroxide (IR-746), IR 144 and mixtures thereof.

The polymers used to make any of the cover layers can be made by any method well known in the art. When the cover layers include a laser dye, a powder laser dye can be added to a polymer solution or the laser dye can be dissolved in solvent and mixed with the polymer solution. The solution or suspension mixture can be used for wet coating methods or coated on carrier films and heated to remove solvent for dry coating methods.

The sacrificial, strippable or permanent covers layers can be applied to the insulating substrate by screen printing, solution coating, dip coating, spin coating spray coating or any wet coating method known by a person of ordinary skill in the art. In some embodiments, the sacrificial, strippable or permanent covers layers can be applied to the insulating substrate by dry film lamination or any other method by known by a person of ordinary skill in the art.

The cover layer is heated and dried to remove any solvent when a wet coating method is used. Next, the printed circuit board precursor is laser patterned using a laser deemed suitable including but not limited to YAG, infrared lasers and ultraviolet lasers. The laser removes portions of the cover layer and the underlying insulating substrate to form one or more pattern elements on the insulating substrate. If a sacrificial layer is used, it is removed by treatment with a suitable liquid followed by metallization. If a strippable layer is used, after the patterned elements are formed, the printed circuit board precursor is plated. Then the strippable cover layer is removed by treatment with a suitable liquid.

While the invention has been described with respect to a limited number of embodiments and formulations, it will be appreciated that many variations, modifications and other applications of the invention may be made. Nothing from the foregoing is intended to limit the scope of the invention. Limitations to the invention are intended to be defined solely by the following claims.

What is claimed is:

1. A method for forming a metallized pattern on a printed circuit board substrate, said method comprising:
   (1) providing a printed circuit board precursor having a insulating substrate comprising a spinel crystal filler and a strippable cover layer;
   (2) treating the printed circuit board precursor with a laser to
      i) remove portions of the strippable cover layer and the underlying insulating substrate to form one or more pattern elements on the insulating substrate, wherein said pattern elements are selected from the group consisting of a trough, a via, and combinations thereof and
      ii) to activate the spinel crystal filler;
   (3) metallizing the pattern elements on the insulating substrate; and (4) removing over-plating and debris which has been metallized by removal of the strippable cover layer by treatment with a liquid having a ph less than 7.

* * * * *